United States Patent
Komamura et al.

(10) Patent No.: US 6,873,275 B2
(45) Date of Patent: Mar. 29, 2005

(54) DIGITAL SIGNAL CONVERSION APPARATUS, DIGITAL SIGNAL CONVERSION METHOD, AND COMPUTER-READABLE RECORDING MEDIUM IN WHICH DIGITAL SIGNAL CONVERSION PROGRAM IS RECORDED

(75) Inventors: Mitsuya Komamura, Tsurugashima (JP); Keiichi Yamauchi, Tsurugashima (JP)

(73) Assignee: Pioneer Corporation, Tokyo-To (JP)

( * ) Notice: Subject to any disclaimer, the term of this patent is extended or adjusted under 35 U.S.C. 154(b) by 0 days.

(21) Appl. No.: 10/465,893

(22) Filed: Jun. 20, 2003

(65) Prior Publication Data

US 2004/0001011 A1 Jan. 1, 2004

(30) Foreign Application Priority Data

Jun. 27, 2002 (JP) .................................... P2002-187745

(51) Int. Cl.[7] .............................................. H03M 3/00
(52) U.S. Cl. ..................... 341/143; 341/144; 375/238
(58) Field of Search ............................. 341/143, 152, 341/144; 375/238

(56) References Cited

U.S. PATENT DOCUMENTS

| | | | |
|---|---|---|---|
| 4,825,144 A | 4/1989 | Alberkrack et al. | 323/272 |
| 5,548,286 A | 8/1996 | Craven | 341/126 |
| 5,617,058 A * | 4/1997 | Adrian et al. | 330/10 |
| 6,373,336 B1 * | 4/2002 | Anderskouv et al. | 330/10 |
| 6,642,875 B2 * | 11/2003 | Harada et al. | 341/144 |

FOREIGN PATENT DOCUMENTS

| | | | | |
|---|---|---|---|---|
| EP | 1 050 971 | | 11/2000 | ............ H03M/5/08 |
| JP | 61065513 | | 4/1986 | ........... H03H/11/04 |

* cited by examiner

*Primary Examiner*—Peguy jeanPierre
(74) *Attorney, Agent, or Firm*—Morgan, Lewis & Bockius LLP

(57) ABSTRACT

The digital signal conversion apparatus comprises: an oversampling circuit that samples the input digital signal at high frequency; a polarity-inversion circuit that inverts the polarity of the sampled digital signal; interpolation circuit (A) and interpolation circuit (B) that perform interpolation of each respective digital signal; noise-shaping circuit (A) and noise-shaping circuit (B) that perform noise shaping on the interpolated signals; PWM conversion circuit (A) and PWM conversion circuit (B) that perform PWM conversion on the noise-shaped signals; and a switching circuit for driving a load based on the PWM signals from PWM conversion circuit (A) and PWM conversion circuit (B).

16 Claims, 14 Drawing Sheets

DIGITAL SIGNAL CONVERSION APPARATUS, DIGITAL SIGNAL CONVERSION METHOD, AND COMPUTER-READABLE RECORDING MEDIUM IN WHICH DIGITAL SIGNAL CONVERSION PROGRAM IS RECORDED

BACKGROUND OF THE INVENTION

1. Field of the Invention

This invention relates to a digital signal conversion apparatus and digital signal conversion method that performs Pulse Width Modulation (PWM) on an input digital signal and converts it to an analog signal.

2. Description of the Related Art

One typical well-known method used by digital-to-analog converters for converting an input digital signal to an analog signal is the so-called PWM method, which converts an input digital signal to a PWM waveform and then converts that to an analog signal. The PWM method is also used in digital amps (D-class amp) that drive loads such as speakers or the like based on the input signal. The PWM of a digital signal (hereafter referred to as simply digital PWM) inevitably generates non-linear distortion.

Conventionally, 2-value PWM in which the PWM waveform takes the two values +1 and −1, and 3-value PWM in which the waveform takes the three values +1, 0 and −1 have been known as PWM modulation methods. Since 3-value PWM generates no even-ordered non-linear distortion, it is preferred to 2-value PWM from the aspect of lower distortion rate.

SUMMARY OF THE INVENTION

In the case of the digital PWM, 3-value PWM is performed by generating a first PWM signal for an input digital signal, a second PWM signal for the two's complement (polarity inversion) of the input digital signal, and not-PWM signals for those signals, and controlling an H-bridge type switching circuit with those four signals.

Also, in order to reduce non-linear distortion, 2-value PWM is performed on an interpolated digital signal to approximate a PWM for an analog signal, because the PWM of the analog signal has no non-linear distortion.

However, if 3-value PWM is performed on the interpolated digital signal by merely generating the second PWM signal for the two's complement of the interpolated digital signal, non-linear distortion becomes higher than the case of 2-value PWM, because the second PWM signal for the two's complement of the interpolated digital signal does not approximate a PWM signal for a polarity inverted analog signal. So, it is difficult to practically perform 3-value PWM of a digital signal using together with the interpolation method.

Taking the above problems into consideration, it is the object of this invention to provide 3-value PWM that interpolates a signal having inverted polarity with respect to that of the input digital signal and generates a second PWM signal for the interpolated signal to approximate a PWM signal for a signal having inverted polarity with respect to that of the analog signal, and is capable of reducing non-linear distortion and improving power efficiency.

The above object of present invention can be achieved by a digital signal conversion apparatus of the present invention. The digital signal conversion apparatus is provided with: a polarity-inversion device for inverting the polarity of an input digital signal; a first interpolation device for interpolating the input digital signal; a second interpolation device for interpolating the digital signal inverted by said polarity-inversion device; a first conversion device for performing PWM conversion on the signal interpolated by said first interpolation device; a second conversion device for performing PWM conversion on the signal interpolated by said second interpolation device; and an output device for outputting a PWM signal based on the output from said first conversion device and output from said second conversion device.

The digital signal conversion apparatus of this invention performs PWM conversion by using the input digital signal and a signal having inverted polarity with respect to that digital signal. The digital signal conversion apparatus converts the inputted digital signal to analog signal by performing the PWM conversion. When the PWM conversion is performed, interpolation is performed by a specified interpolation method for both the input digital signal and the digital signal with inverted polarity in order to reduce non-linear distortion. The PWM conversion is then performed for each of the interpolated signals by PWM conversion circuits, and the load is driven based on the PWM signals from the two PWM conversion circuits. Therefore, it is possible to reproduce the signal with small non-linear distortion.

In one aspect of the present invention, in case where said input digital signal is performed over sampling, the digital signal conversion apparatus of the present invention is further provided with; a first noise-shaping device for performing noise shaping on the signal interpolated by said first interpolation device and outputting the signal performed noise shaping to said first PWM conversion device; and a second noise-shaping device for performing noise shaping on the signal interpolated by said second interpolation device and outputting the signal performed noise shaping to said second PWM conversion device.

The digital signal conversion apparatus of this invention over samples the input digital signal and performs PWM conversion of the over sampled digital signal and a signal having inverted polarity with respect to that digital signal. Furthermore, the digital signal conversion apparatus converts the inputted digital signal to an analog signal by performing the PWM conversion. When the PWM conversion is performed, interpolation is performed by a specified interpolation method for both of the over sampled digital signal and the over sampled digital signal with inverted polarity in order to reduce non-linear distortion. In order to reduce the quantization noise in the audible range of both of these interpolated signals, noise shaping is performed by respective noise-shaping circuits. The PWM conversion is performed for the noise-shaped signals by PWM conversion circuits, and the load is driven based on the PWM signals from the two PWM conversion circuits. Therefore, it is possible to reproduce the signal with small non-linear distortion.

In one aspect of the present invention, the digital signal conversion apparatus of the present invention is further provided with; a first inversion device for inverting the level of the output from said first PWM conversion device; and a second inversion device for inverting the level of the output from said second PWM conversion device.

The digital signal conversion apparatus of this invention obtains a not PWM signal for the PWM signal from the first conversion device, and obtains a not PWM signal for the PWM signal from the second conversion device.

Accordingly, the load is driven based on the two PWM signals and two not PWM signals from two PWM conversion circuits. Therefore, it is possible to reproduce the signal with small non-linear distortion.

In one aspect of the present invention, the digital signal conversion apparatus of the present invention is further provided with; wherein said output device is a H-bridge type switching circuit.

In the digital signal conversion apparatus of this invention, the output device is a H-bridge load-driving circuit having four switches. The two PWM signals and two not PWM signals are input to the four switches and the load is driven by a three-value PWM signal. When the input digital signal is zero, the voltage applied to the load is also zero, so the load can be driven with good power efficiency.

In one aspect of the present invention, the digital signal conversion apparatus of the present invention is further provided with; wherein said output device is a differential amplifier.

The digital signal conversion apparatus of this invention forms a D/A converter by inputting the PWM signal that is output from the first PWM conversion device and the PWM signal that is output from the second PWM conversion device to a differential amplifier.

The above object of present invention can be achieved by a digital signal conversion method of the present invention. The digital signal conversion method is provided with: a polarity-inversion process of inverting the polarity of an input digital signal; a first interpolation process of interpolating the input digital signal; a second interpolation process of interpolating the digital signal inverted by said polarity-inversion process; a first conversion process of performing PWM conversion on the signal interpolated by said first interpolation process; a second conversion process of performing PWM conversion on the signal interpolated by said second interpolation process; and an output process of outputting a PWM signal based on the output from said first conversion process and output from said second conversion process.

The digital signal conversion method of this invention performs PWM conversion by using the input digital signal and a signal having inverted polarity with respect to that digital signal. The digital signal conversion method converts the inputted digital signal to analog signal by performing the PWM conversion. When the PWM conversion is performed, interpolation is performed by a specified interpolation method for both the input digital signal and the digital signal with inverted polarity in order to reduce non-linear distortion. The PWM conversion is then performed for each of the interpolated signals by PWM conversion process, and the load is driven based on the PWM signals from the two PWM conversion process. Therefore, it is possible to reproduce the signal with small non-linear distortion.

In one aspect of the present invention, in case where said input digital signal is performed over sampling, the digital signal conversion method of the present invention is further provided with; a first noise-shaping process of performing noise shaping on the signal interpolated by said first interpolation process; and a second noise-shaping process of performing noise shaping on the signal interpolated by said second interpolation process, wherein said first conversion process performing PWM conversion on the signal performed noise shaping by said first noise-shaping process, and said second conversion process performing PWM conversion on the signal performed noise shaping by said second noise-shaping process.

The digital signal conversion method of this invention over samples the input digital signal and performs PWM conversion of the over sampled digital signal and a signal having inverted polarity with respect to that digital signal. Furthermore, the digital signal conversion apparatus converts the inputted digital signal to an analog signal by performing the PWM conversion. When the PWM conversion is performed, interpolation is performed by a specified interpolation method for both of the over sampled digital signal and the over sampled digital signal with inverted polarity in order to reduce non-linear distortion. In order to reduce the quantization noise in the audible range of both of these interpolated signals, noise shaping is performed by respective noise-shaping process. The PWM conversion is performed for the noise-shaped signals by PWM conversion process, and the load is driven based on the PWM signals from the two PWM conversion circuits. Therefore, it is possible to reproduce the signal with small non-linear distortion.

In one aspect of the present invention, the digital signal conversion method of the present invention is further provided with; a first inversion process of inverting the level of the output from said first PWM conversion process; and a second inversion process of inverting the level of the output from said second PWM conversion process.

The digital signal conversion method of this invention obtains a not PWM signal for the PWM signal from the first conversion process, and obtains a not PWM signal for the PWM signal from the second conversion process. Accordingly, the load is driven based on the two PWM signals and two not PWM signals from two PWM conversion circuits. Therefore, it is possible to reproduce the signal with small non-linear distortion.

The above object of present invention can be achieved by a recording medium of the present invention. The recording medium is a recording medium wherein a digital signal conversion program is recorded so as to be read by a computer, the program causing the computer to function as: a polarity-inversion device for inverting the polarity of an input digital signal; a first interpolation device for interpolating the input digital signal; a second interpolation device for interpolating the digital signal inverted by said polarity-inversion device; a first conversion device for performing PWM conversion on the signal interpolated by said first interpolation device; a second conversion device for performing PWM conversion on the signal interpolated by said second interpolation device; and an output device for outputting a PWM signal based on the output from said first conversion device and output from said second conversion device.

The digital signal conversion program recorded on the recording medium of this invention performs PWM conversion by using the input digital signal and a signal having inverted polarity with respect to that digital signal. The digital signal conversion program converts the inputted digital signal to analog signal by performing the PWM conversion. When the PWM conversion is performed, interpolation is performed by a specified interpolation method for both the input digital signal and the digital signal with inverted polarity in order to reduce non-linear distortion. The PWM conversion is then performed for each of the interpolated signals by PWM conversion process, and the load is driven based on the PWM signals from the two PWM conversion process. Therefore, it is possible to reproduce the signal with small non-linear distortion.

In one aspect of the present invention, in case where said input digital signal is performed over sampling, the digital signal conversion program causes the computer to function as a first noise-shaping device for performing noise shaping on the signal interpolated by said first interpolation device; a second noise-shaping device for performing noise shaping on the signal interpolated by said second interpolation device; said first conversion device performing PWM conversion on the signal performed noise shaping by said first noise-shaping device; and said second conversion device performing PWM conversion on the signal performed noise shaping by said second noise-shaping device.

The digital signal conversion program recorded on the recording medium of this invention over samples the input digital signal and performs PWM conversion of the over sampled digital signal and a signal having inverted polarity with respect to that digital signal. Furthermore, the digital signal conversion program converts the inputted digital signal to an analog signal by performing the PWM conversion. When the PWM conversion is performed, interpolation is performed by a specified interpolation method for both of the over sampled digital signal and the over sampled digital signal with inverted polarity in order to reduce non-linear distortion. In order to reduce the quantization noise in the audible range of both of these interpolated signals, noise shaping is performed by respective noise-shaping process. The PWM conversion is performed for the noise-shaped signals by PWM conversion process, and the load is driven based on the PWM signals from the two PWM conversion circuits. Therefore, it is possible to reproduce the signal with small non-linear distortion.

DESCRIPTION OF THE PREFERRED EMBODIMENTS

Next, the preferred embodiments of the present invention will be explained based on the drawings.

Each of the embodiments explained below are embodiments for when the invention is applied to a digital signal conversion apparatus.

Moreover, the term 'level' referred to in this disclosure indicates whether the PWM waveform is high level or low level, the term 'level inversion' indicates inversion of the level from high level to low level, or from low level to high level, the term 'polarity' indicates whether the signal is + or −, and the term 'polarity inversion' indicates that the polarity has been inverted from + to −, or from − to +.

Furthermore, in each of the embodiments the symbol (A) given to the PWM conversion circuit, interpolation circuit, noise-shaping circuit, and PWM signal indicates the A signal when there are two PWM signals, and similarly, the symbol (B) given to the PWM signal indicates the B signal of the two PWM signals.

(First Embodiment)

A first embodiment of the digital signal conversion apparatus of this invention will be explained by using FIG. 1 to FIG. 9.

This embodiment is a digital signal conversion apparatus that drives a load using a three-value PWM signal, and together with increasing the accuracy of interpolation and reducing non-linear distortion. It is an example of a digital signal conversion apparatus that has good power efficiency since an output is zero when on input digital signal is zero.

Figure 1:
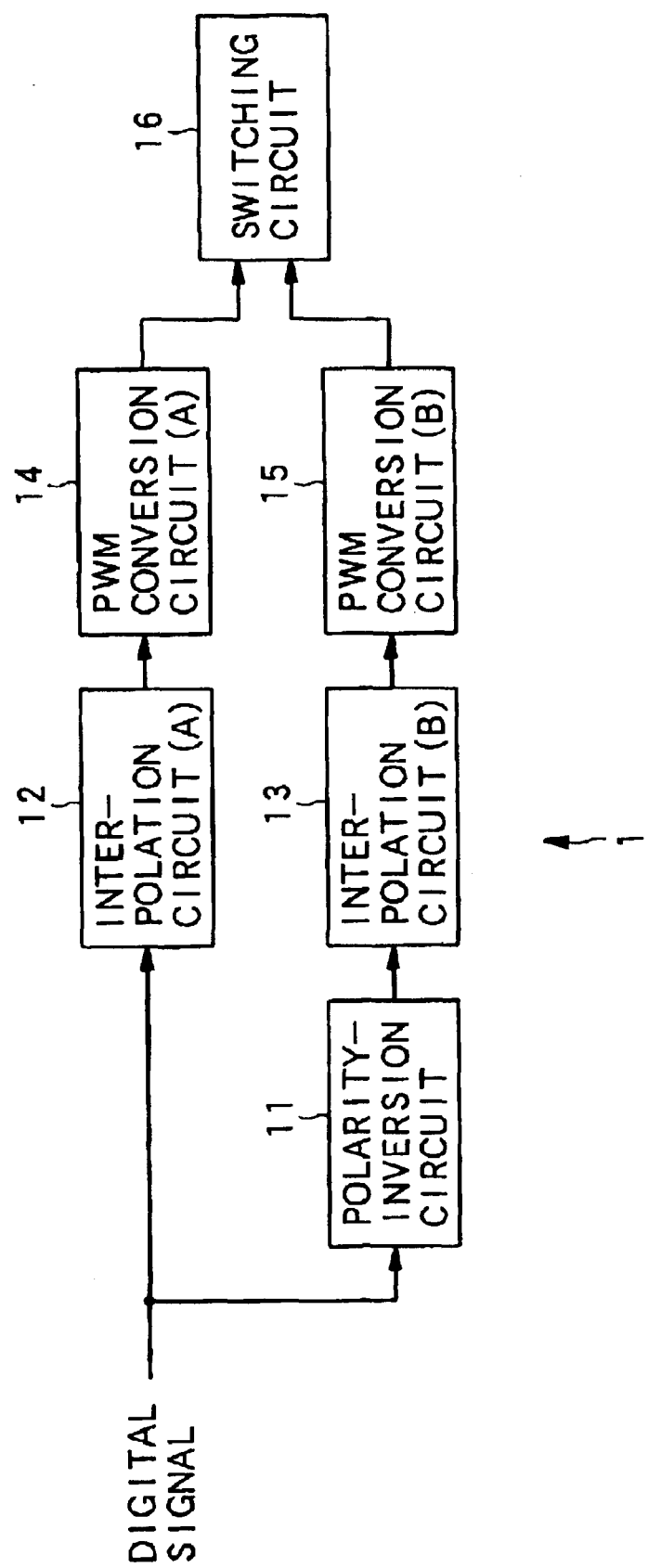
FIG. 1 is a block diagram showing the construction of the digital signal conversion apparatus of a first embodiment of the invention.

FIG. 1 is a block diagram showing the construction of the digital signal conversion apparatus of a first embodiment of the invention.

As shown in FIG. 1, the digital signal conversion apparatus 1 of this embodiment comprises: a polarity-inversion circuit 11 that inverts the input digital signal; an interpolation circuit (A) 12 that performs interpolation (described later) of the input digital signal; an interpolation circuit (B) 13 that performs interpolation (described later) of the inverted digital signal; a PWM conversion circuit (A) 14 that performs PWM conversion for the signal interpolated by the interpolation circuit (A) 12; a PWM conversion circuit (B) 15 that performs PWM conversion for the signal interpolated by the interpolation circuit (B) 13; and a switching circuit 16 for driving a load based on the PWM signals from the PWM conversion circuit (A) 14 and PWM conversion circuit (B) 15.

Figure 2:
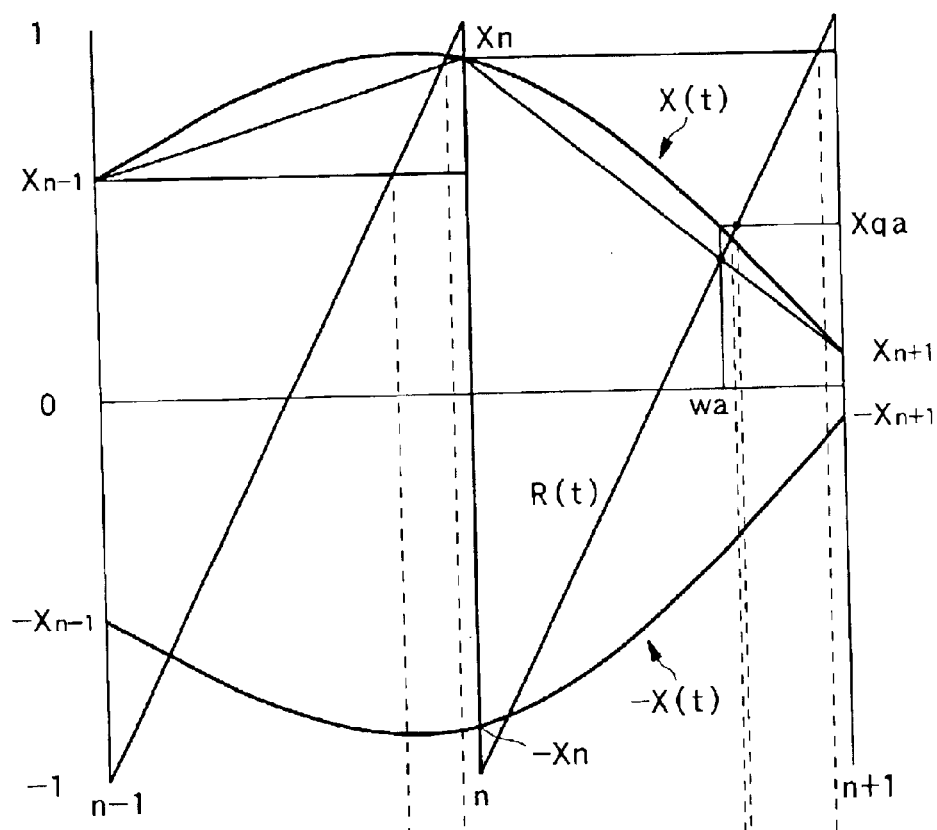
FIG. 2 is a drawing for explaining PWM for the analog signal, digital signal and interpolated values.

The polarity-inversion circuit 11 generates a digital signal that has a polarity that is inverted with respect to the input digital signal, and performs this conversion at all of the sampling points. For example, when a digital signal value (Xn) is input at sampling point n as shown in FIG. 2, the polarity-inversion circuit 11 generates a digital signal −Xn at that sampling point.

The interpolation circuit (A) 12 performs interpolation such that the difference between the positions where the input digital signal intersects with a saw-tooth shaped reference signal and the positions where the original analog signal intersects with a reference signal becomes small in order to reduce the size of distortion.

The interpolation circuit (B) 13 performs interpolation such that the difference between the positions where the a signal having inverted polarity with respect to the input digital signal intersects with a reference signal and the positions where the signal inverted with respect to the analog signal intersects with a saw-tooth shaped reference signal becomes small in order to reduce the size of distortion.

The interpolation performed by the interpolation circuit (A) 12 and interpolation circuit (B) 13 will be explained later using FIG. 2 and FIG. 3.

The PWM conversion circuit (A) 14 performs PWM conversion based on the signal interpolated by the interpolation circuit (A) 12 and the points of intersection between that interpolated signal and reference signal such that the sections where the interpolated signal are higher than the reference signal are high level, and generates a not PWM converted signal (hereafter called the not PWM (A) signal) whose level is inverted with respect that of this PWM converted signal (hereafter called the PWM (A) signal).

The PWM conversion circuit (B) 15 performs PWM conversion based on the signal interpolated by the interpolation circuit (B) 13 and the points of intersection between that interpolated signal and reference signal such that the sections where the interpolated signal are higher than the reference signal are high level, and generates a not PWM converted signal (hereafter called the not PWM (B) signal) whose level is inverted with respect that of this PWM converted signal (hereafter called the PWM (B) signal).

As mentioned above, the switching circuit 16 forms a circuit for driving a load based on the PWM (A) signal, not PWM (A) signal, PWM (B) signal and not PWM (B) signal.

This switching circuit 16 is capable of driving a load using a three-value PWM signal, and is such that it can form a digital signal conversion apparatus that has zero output when the input digital signal is zero, and has good power efficiency.

Incidentally construction and operation of the switching circuit 16 will be explained later using FIG. 8 and FIG. 9.

Next, the method of interpolation used by interpolation circuit (A) 12 and interpolation circuit (B) 13 of this embodiment will be explained by using FIG. 2 and FIG. 3.

Figure 3:
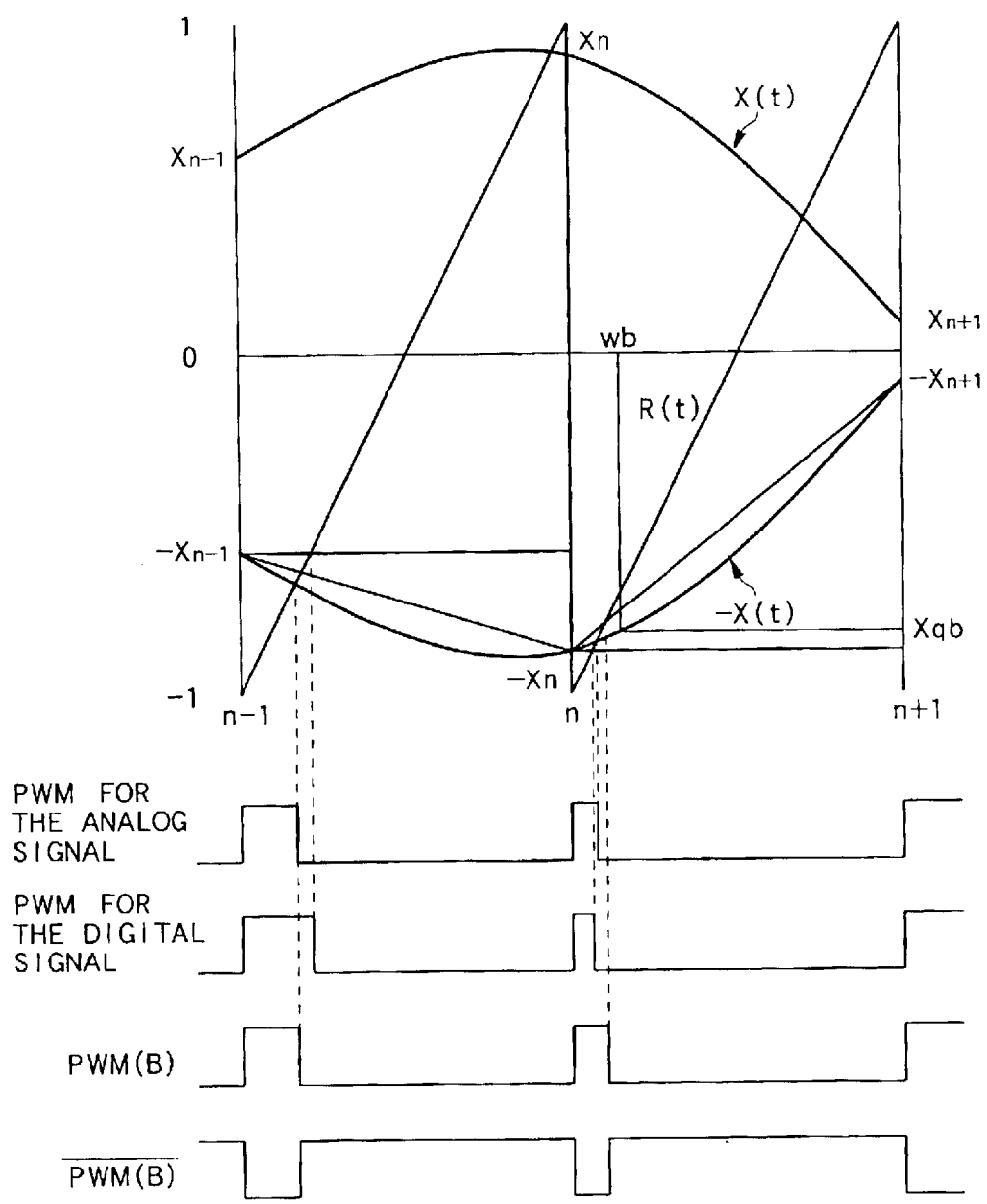
FIG. 3 is a drawing for explaining PWM for the inverted analog signal, inverted digital signal and interpolated values.

FIG. 2 is a drawing showing the PWM for the analog signal, digital signal and interpolated values, and FIG. 3 is a drawing showing the PWM for the inverted analog signal, inverted digital signal and interpolated values.

Normally, when performing PWM conversion, a sawtooth-shaped wave R(t) is used as the reference signal, and as shown in FIG. 2 and FIG. 3, the sawtooth-shaped reference signal R(t) increases linearly from −1 to +1 during a sampling period.

Also, the digital signal generated by sampling the original analog signal X(t) at the sampling points n−1, n and n+1, has the value $X_{n-1}$ from sampling point n−1 to sampling point n, and has the value $X_n$ from sampling point n to sampling point n+1, and when the polarity is inverted, the original analog signal X(t) becomes −X(t) and the digital signal has the value $-X_{n-1}$ from sampling point n−1 to sampling point n, and has the value $-X_n$ from sampling point n to sampling point n+1.

Conventionally, in comparing the PWM generated for the digital signal based on the point of intersection between the digital signal $X_n$ and sawtooth-shaped wave R(t) with the PWM generated for the analog signal based on the point of intersection between the analog signal X(t) and sawtooth-shaped wave R(t), a difference occurs in the PWM of the analog signal and the PWM of the digital signal. Therefore, this difference between the PWM of the analog signal and the PWM of the digital signal causes non-linear distortion.

Similarly, in comparing the PWM generated for the inverted digital signal based on the point of intersection between the digital signal $-X_n$ and the sawtooth-shaped wave R(t) with the PWM generated for the inverted analog signal based on the point of intersection between the analog signal −X(t) and the sawtooth-shaped wave R(t), a difference occurs in the PWM of the analog signal and the PWM of the digital signal. Therefore, this difference between the PWM of the analog signal and the PWM of the digital signal causes non-linear distortion.

Here, the non-linear distortion that occurs in the digital PWM will be explained later using FIG. 4 to FIG. 7.

Figure 4:
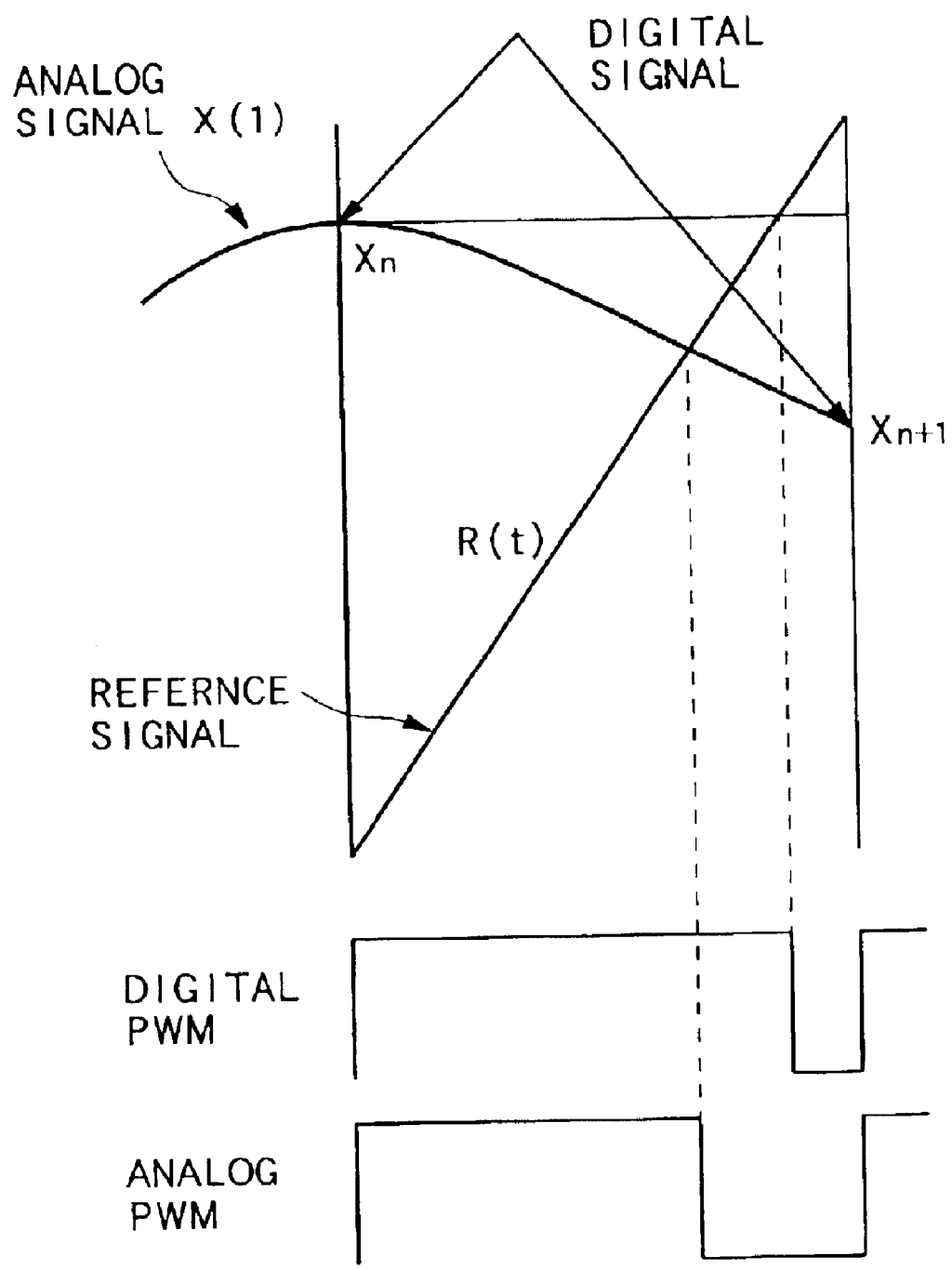
FIG. 4 is a drawing for explaining the cause of non-linear distortion in digital PWM.
Figure 5:
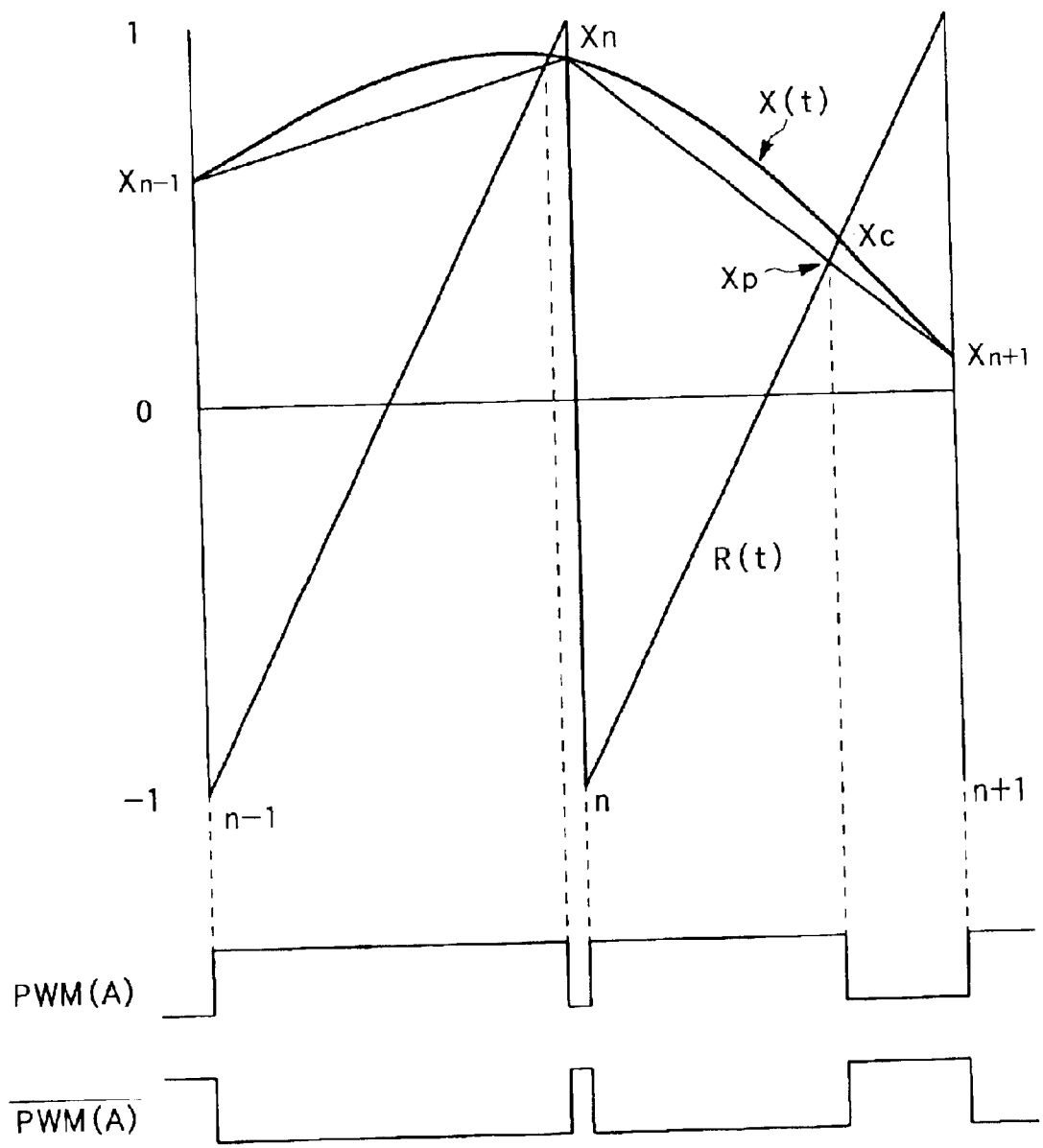
FIG. 5 is a drawing for explaining convention PWM for an analog signal, digital signal and interpolated values.

FIG. 4 is a drawing for explaining the cause of non-linear distortion in digital PWM, and FIG. 5 is a drawing for explaining conventional PWM for the analog signal, digital signal, and interpolated values.

Figure 6:
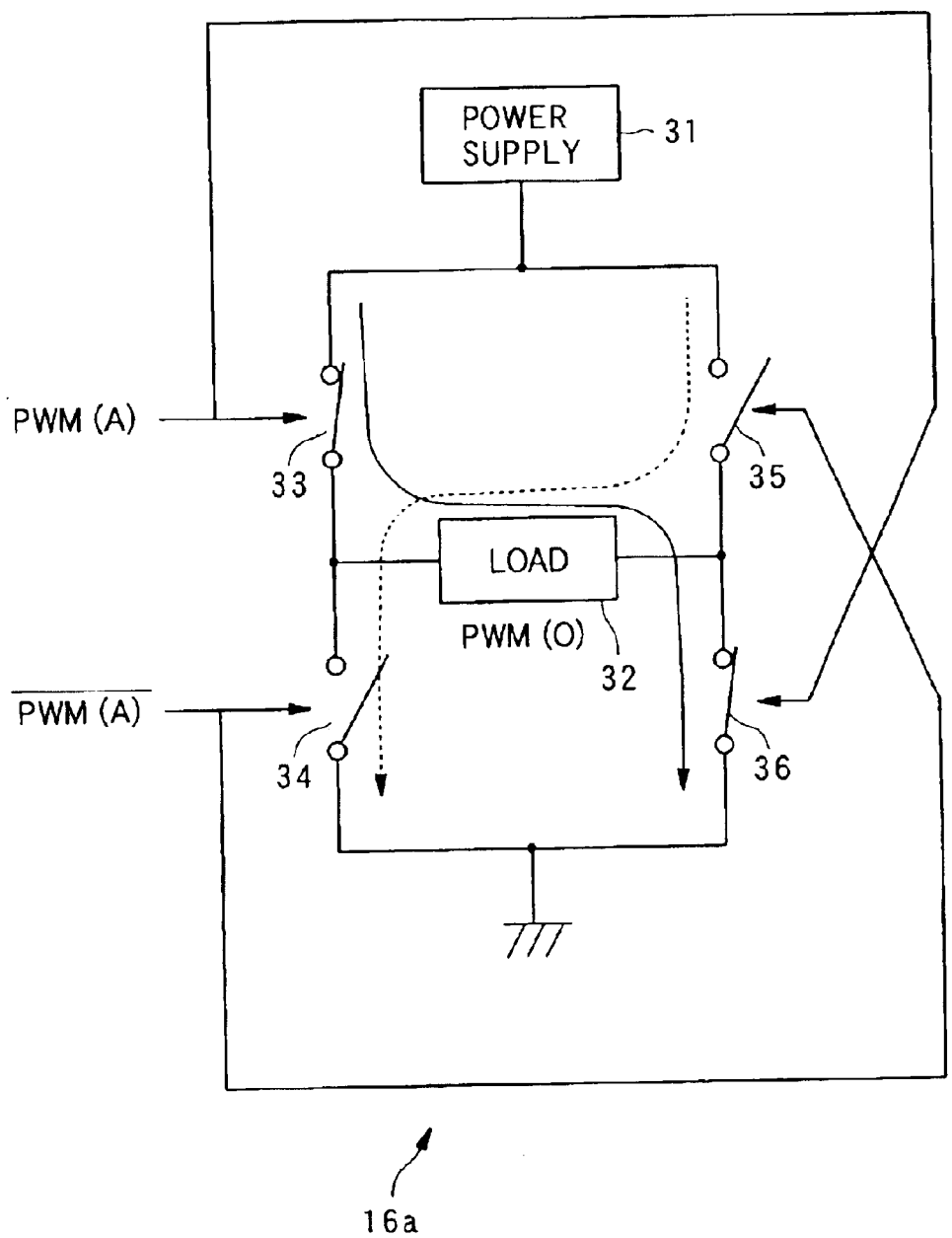
FIG. 6 is a drawing showing the load-driving switching circuit for the PWM shown in FIG. 5.
Figure 7:
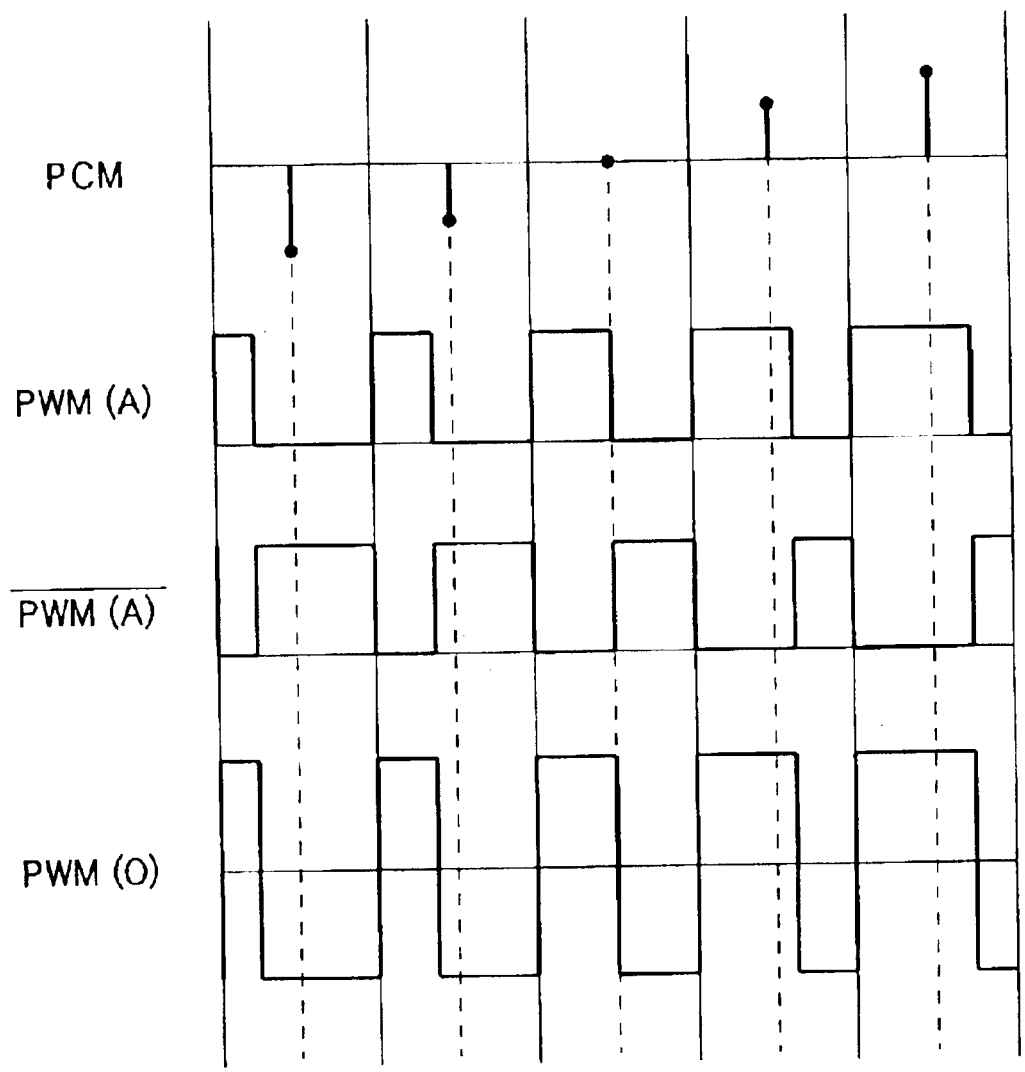
FIG. 7 is a drawing showing the two-value PWM waveform for load driving by the switching circuit shown in FIG. 6.

Also, FIG. 6 is a drawing showing a load-driving switching circuit for the PWM shown in FIG. 5, and FIG. 7 is a drawing showing the two-value PWM waveform for load driving by the switching circuit shown in FIG. 6.

Normally, while the input signal is higher than the sawtooth-shaped reference signal R(t), the PWM is at high level. Therefore, when the input is an analog signal, an analog PWM waveform as shown in FIG. 4 is obtained. On the other hand, when the input is a discrete digital signal in the time direction, the input signal is compared with the reference signal R(t), and while the input signal is higher than the reference signal, the PWM is at high level. Therefore, when the input is a digital signal, a digital PWM waveform as shown in FIG. 4 is obtained. Accordingly, as shown in FIG. 4, this digital PWM waveform is different from the analog PWM waveform, and this difference causes non-linear distortion to occur.

Due to this distortion, a method has been used for removing this non-linear distortion that interpolates the input digital signal and brings it closer to that of the analog signal.

As shown in FIG. 5, in this prior interpolation method, the digital data $X_n$ and $X_{n+1}$ are connected with a straight line between sampling points, or to be more specific, between sampling point n and sampling point n+1, and the point of intersection Xp between that straight line and the reference signal R(t) is found, and then this point of intersection Xp is used as an approximate value for the original analog signal Xc.

For example, when performing the two-value PWM modulation method with a digital amp, the digital amp uses an H-bridge type a switching circuit as shown in FIG. 6 as the load-driving circuit.

In the switching circuit of this digital amp, the PWM (A) signal that is obtained from the input PCM signal is input at switch 33 and switch 36, and the inverted not PWM (A) signal, which is inverted the PWM (A) signal, is input at switch 34 and switch 35, and that switching circuit controls the direction of current flowing to the load according to the opened/closed state of the switches 33, 34, 35 and 36. Therefore, as shown in FIG. 7, in the switching circuit, the voltage PWM (0) is a two-value driving voltage that swings between the plus side and minus side, so even when the PCM signal is zero, current flows to the load 32 having an output waveform such that during the sampling period, it is on the plus side for half of the period and is on the minus side for half of the period. In other words, in the switching circuit, the current flows back-and-forth and power is consumed such that the integral of current for the sampling period becomes zero.

On the other hand, in addition to two-value PWM modulation where the PWM waveform takes the two values +1 and −1, three-value PWM modulation is also known as a PWM modulation method in which the PWM waveform takes the three values +1, 0 and −1, and this three-value PWM modulation is superior to two-value PWM modulation from the aspect of distortion rate in that even-ordered non-linear distortion does not occur.

Also, in the two-value PWM modulation method, since only the two values +1 and −1 are taken, in a digital amp that uses an H-bridge type switching circuit as the load-driving circuit, the output waveforms moves to the plus side for half of the sampling period and moves to the minus side for half of the sampling period when input signal is zero. Therefore, power is consumed even when the input signal is zero. However, in the three-value PWM modulation method, the output also becomes zero when the input is zero. Therefore, this three-value PWM modulation is superior to two-value PWM modulation from the aspect of power efficiency as well.

For example, as shown in FIG. 8 and as will be described later, when performing the three-value PWM modulation method using an H-bridge type switching circuit as the load-driving circuit, a first PWM signal for the input signal and a second PWM signal for the signal having inverted polarity with respect to the input signal, as well as not PWM signals of these signals, controls the H bridge type switching circuit. Therefore, the three-value PWM modulation method differs from the two-value PWM modulation described above.

When the input is an analog signal, in this switching circuit, the PWM (A) signal that was generated from the input analog signal is input at switch 33, and a not PWM (A) signal having the inverted level of the PWM (A) signal is input at switch 34. Furthermore, the PWM (B) signal was generated from the signal having inverted polarity with respect to the input analog signal is input at switch 35, and the not PWM (B) signal having the inverted level of the PWM (B) signal is input at switch 36. This switching circuit controls the direction of the current flowing to the load 32 according to the opened/closed status of these switches 33, 34, 35 and 36.

Therefore, in this switching circuit, the voltage PWM (0) applied to the load 32 is a three-value driving voltage that changes among the plus side, 0 and minus side, so when the input is zero the output is also zero. Thus, the three-value PWM modulation is superior to the two-value PWM modulation from the aspect of power efficiency.

Moreover, when the input is a digital signal, in order to perform three-value PWM modulation, a first PWM signal and a second PWM signal that corresponds to the two's complement of the first PWM signal are calculated from the input signal. The two's complement of the input signal is a signal having inverted polarity with respect to the input signal. Furthermore, the H-bridge type switching circuit is controlled based on the calculated first PWM signal and second PWM signal as well as the not PWM signals for those signals. Therefore, in this kind of three-value PWM modulation of a digital signal, in addition to improving the power efficiency it is also has the effect that even-ordered non-linear distortion does not occur.

In the PWM method when the input is a digital signal, non-linear distortion occurs as described above, so the digital signal is interpolated to bring it close to the analog signal. However, in the case of the three-value PWM modulation method described above, the second PWM signal for the two's complement of the input digital signal after interpolation differs from the second PWM signal for the signal having inverted polarity with respect to the input analog signal.

Therefore, when three-value PWM modulation is performed as described above by generating a first PWM signal from the input digital signal after interpolation, and a second PWM signal that corresponds to the two's complement of the interpolated signal, and controlling the H-bridge type switching circuit by the these signals and the not PWM signals of these signals, the non-linear distortion increases.

Therefore, in this embodiment, in order to reduce the distortion, an interpolation method is used.

More specifically, in this embodiment, as shown in FIG. 2, the interpolation circuit (A) 12 first calculates the time Wa at the point of intersection between the straight line that connects the sample value $X_n$ of the current sampling point n and the sample value $X_{n+1}$ at the next sampling point, and the reference signal R(t) by using an equation (1). Furthermore, the interpolation circuit (A) 12 calculates the amplitude Xqa at the time Wa of the analog signal X(t) based on the previous sample value $X_{n-1}$, current sample value $X_n$ and next sample value $X_{n+1}$ by using an equation (2) indicating Lagrange interpolation.

$$Wa=[1+0.5(X_{n+0}-X_n)][0.25(X_n+X_{n+1})]+0.5 \qquad \text{Eq. (1)}$$

$$Xqa=0.5X_{n-n}(Wa^2-Wa)+X_n(1-Wa^2)+0.5X_{n+1}(Wa^2-Wa) \qquad \text{Eq. (2)}$$

In this embodiment, the digital conversion apparatus 1 sets this calculated amplitude Xqa as an approximation of the amplitude at the point of intersection between the analog signal X(n) and the reference signal R(t).Also, the calculation process in this interpolation circuit (A) 12 for calculating the time Wa and amplitude Xqa is step S12 to be described later.

Next, as shown in FIG. 3, the digital conversion apparatus 1 similarly calculates the time Wb at the point of intersection between the straight line that connects the value $-X_n$, which is the inverted value of the current sample value, and the value $-X_{n+1}$, which is the inverted value of the next sample value, and the reference signal R(t), by using an equation (3). Furthermore, the digital conversion apparatus 1 calculates the amplitude Xqb at the time Wb of the inverted analog signal −X(t) based on the inverted value $-X_{n-1}$ of the previous sample value, the inverted value $-X_n$ of the current sample value and the inverted value $-X_{n+1}$ of the next sample value, by using an equation (4) indicating Lagrange interpolation.

$$Wb=[1+0.5(X_{n+1}-X_n)-1][0.25(X_n+X_{n+1})]+0.5 \qquad \text{Eq. (3)}$$

$$Xqb-0.5X_{n-1}(Wb^2-Wb)-X_n(1-Wb^2)-0.5X_{n+1}(Wb^2-Wb) \qquad \text{Eq. (4)}$$

In this embodiment, the digital conversion apparatus 1 sets this calculated amplitude Xqb as an approximation of the amplitude at the point of intersection between the inverted analog signal −X(n) and the reference signal R(t) .Also, the calculation process in this interpolation circuit (B) 13 for calculating the time Wb and amplitude Xqb is step S13 to be described later.

Finally, the PWM conversion circuit (A) 14 generates a PWM (A) signal using the Xqa signal interpolated from the original signal $X_n$, and the PWM conversion circuit (B) 15 generates a PWM (B) signal using the Xqb signal interpolated from the inverted signal $-X_n$. Incidentally, this generation process in the PWM conversion circuit (A) 14 is step S14 described later.

As described above, in this embodiment, the PWM signals that generated from the interpolated digital signals have little difference from the PWM signals for the analog signals and that reduces non-linear distortion.

Also, in this embodiment, the digital conversion apparatus 1 inverts the level of the PWM (A) signal to obtain the not PWM (A) signal, and inverts the level of the PWM (B) signal to obtain the not PWM (B) signal.

Incidentally, in this embodiment, the PWM signal is obtained by the interpolation method described above, however, of course, the invention is not limited to this method and any other suitable method can be used.

Next, a switching circuit that is capable of driving a load with three-values as described above will be explained by using FIG. 8A and FIG. 8B. The switching circuit is capable of driving a load with three-values using the PWM (A) signal, not PWM (A) signal, PWM (B) signal and not PWM (B) signal that were obtained.

Figure 8A:
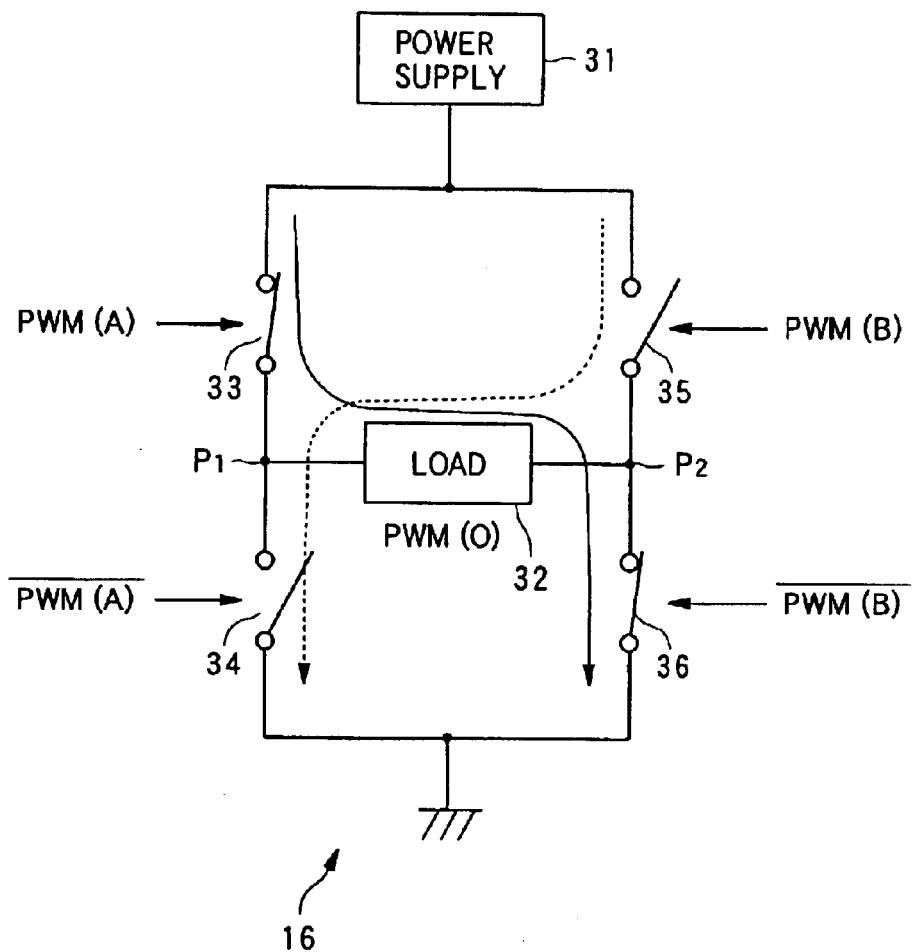
FIG. 8A is a drawing showing the switching circuit of the output device of a digital signal conversion apparatus.
Figure 8B:
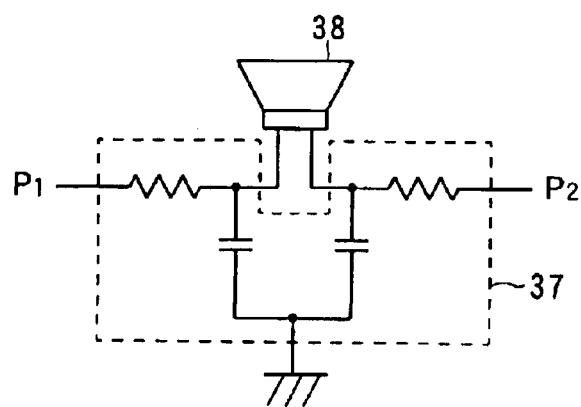
FIG. 8B is a drawing showing an example of a load.

FIG. 8A is a drawing that shows the switching circuit that is used as the output device of the digital signal conversion apparatus. FIG. 8B is a drawing showing an example of a load. Also, the operation for the output process of this switching circuit is performed in step S15 that will be described later.

As shown in FIG. 8A, the switching circuit 16 comprises an H-bridge having switches 33, 34, 35 and 36. In this switching circuit 16, switch 33 and switch 34 are connected in series, and switch 35 and switch 36 are connected in series. Furthermore, one end of switch 33 and switch 35 are connected to the power supply 31, and the other end of switch 34 and switch 36 are connected to ground. The load 32 is located between connection point P1 of switch 33 and switch 34 and connection point p2 of switch 35 and switch 36.

Furthermore, in the switching circuit 16, the PWM (A) signal is input at switch 33, the not PWM (A) signal is input at switch 34, the PWM (B) signal is input at switch 35 and the not PWM (B) signal is input at switch 36.

Therefore, in this switching circuit 16, when the PWM (A) signal is at high level and the not PWM (B) signal is at high level, the not PWM (A) signal becomes low level and the PWM (B) signal becomes low level, and the current flows from the power supply 31 via switch 33, the load 32 and switch 36.

On the other hand, in the switching circuit 16, when the not PWM (A) signal is at high level and the PWM (B) signal is at high level, the PWM (A) signal and not PWM (B) signal become low level, and the current flows from the power supply 31 via switch 35, the load 32 and switch 34.

Figure 9:
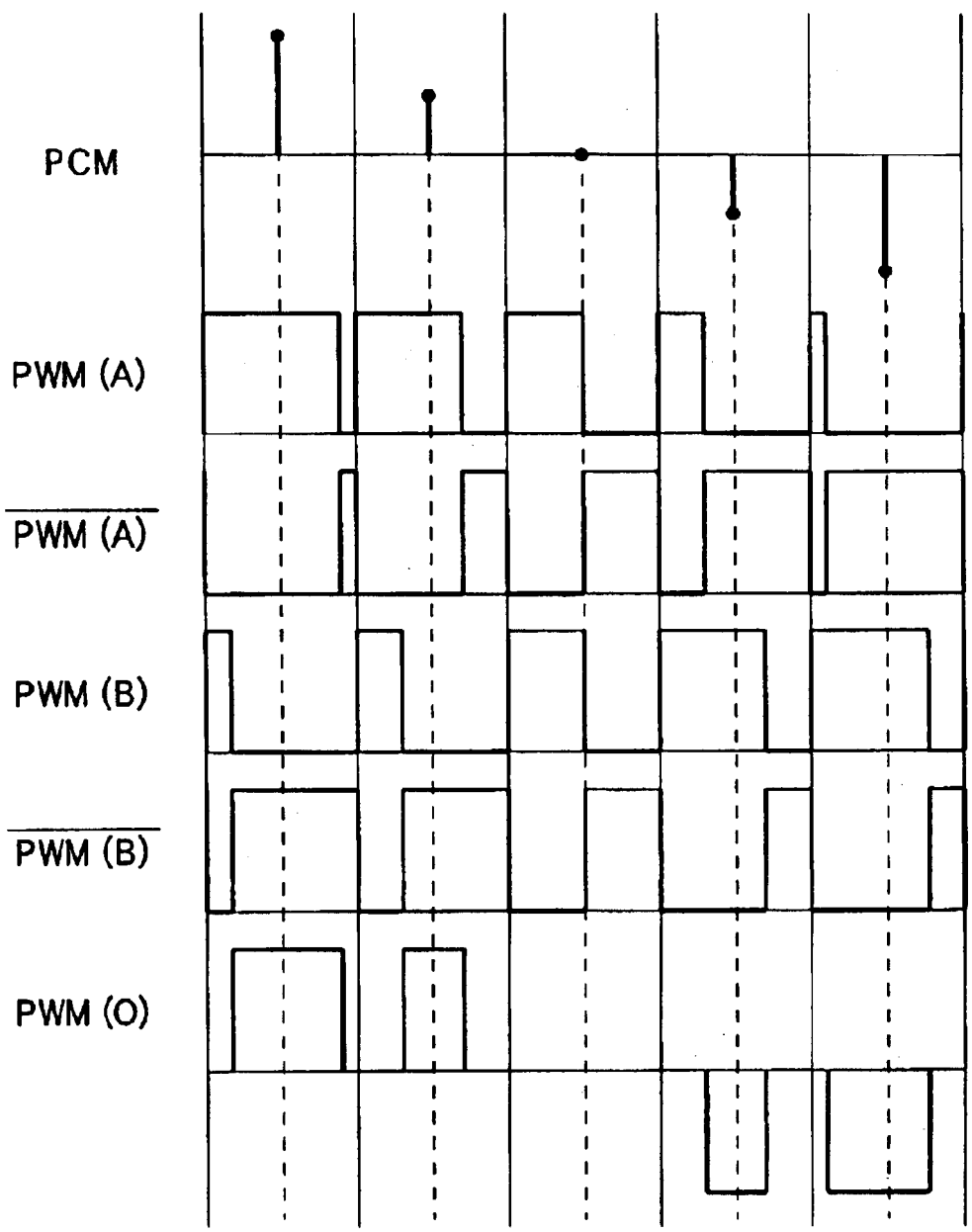
FIG. 9 is a drawing for showing the three-value PWM waveform when driving a load by the switching circuit shown in FIG. 8.

At this time, in the switching circuit 16, when the digital signal (PCM) goes from the plus state, passes zero and becomes minus, the waveform of each pulse changes as shown in FIG. 9.

More specifically, the waveform of the PWM (A) signal changes from a wide pulse to a narrow pulse, and the not PWM (A) signal changes from a narrow pulse to a wide pulse. Moreover, the PWM (B) signal for the signal having inverted polarity changes from a narrow pulse to a wide pulse, and the not PWM (B) signal changes from a wide pulse to a narrow pulse.

When the input signal is zero, the pulse width of all of the PWM signals are the same and are have the half sampling period.

In this embodiment, when the digital signal (PCM) has a large plus value, the voltage PWM (0) applied to the load 32 has a wide pulse width with positive voltage, and as the PCM value becomes smaller, the pulse width also becomes smaller.

On the other hand, when the digital signal (PCM) is a small minus value, the voltage PWM (0) applied to the load 32 has a narrow pulse width with negative voltage, and as the PCM value becomes larger in the minus direction, the pulse width also becomes larger.

Furthermore, when the digital signal (PCM) is zero, the state of switch 33 and switch 35 are ON and switch 34 and switch 36 are OFF and the stage of switch 33 and switch 35 are OFF and switch 34 and switch 36 being ON change repeatedly every half sampling period, and the circuit from the power supply 31 to ground is cut off and current stops flowing to the load.

Therefore, this switching circuit 16 is able to perform 3-value PWM (0) to drive the load 32. Furthermore, in this switching circuit 16, when the input digital signal is zero, the output also becomes zero. Thus, it is possible to use it to form a digital signal conversion apparatus having good power efficiency.

Also, as shown in FIG. 8B for example, in this embodiment a LPF (low pass filter) 37 and speaker 38 are connected between the connection point P1 and connection point P2 as the load 32, and the input digital signal can be output as an audio signal.

Next, the digital signal conversion operation for the digital signal conversion apparatus of this embodiment will be explained by using FIG. 10.

Figure 10:
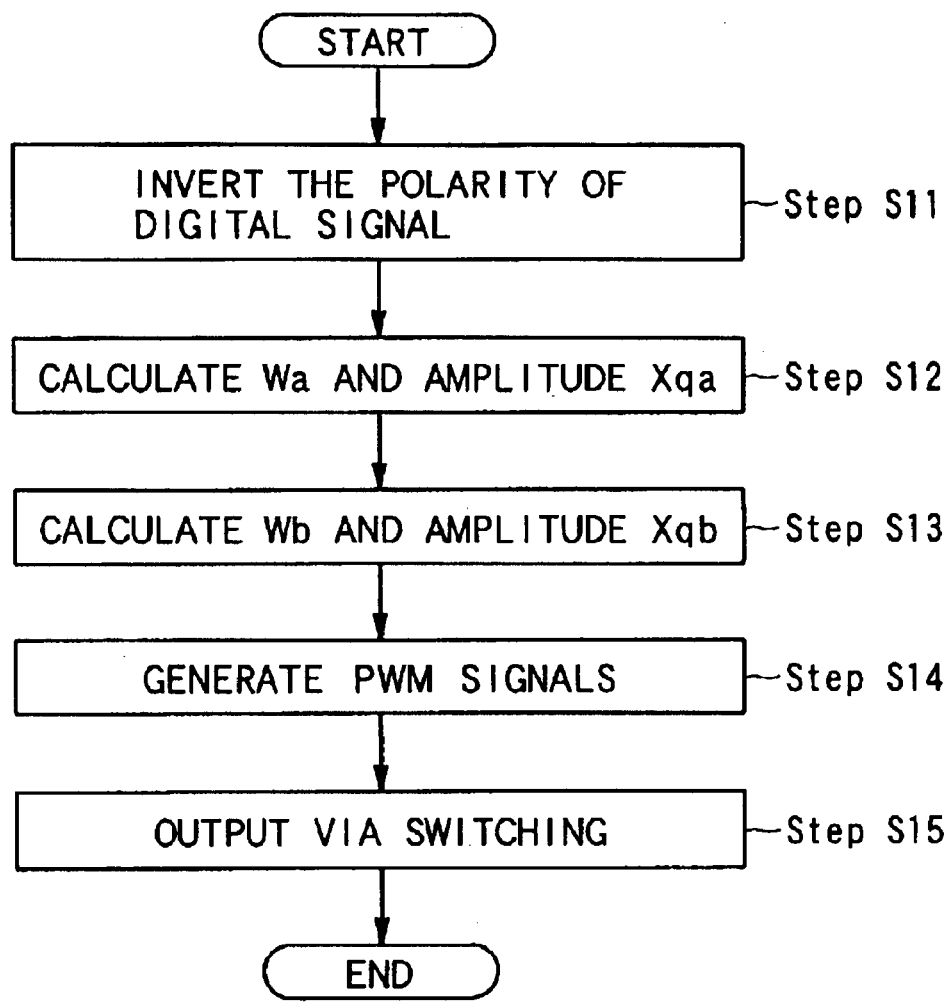
FIG. 10 is a flowchart showing the digital signal conversion operation of this first embodiment of the invention.

FIG. 10 is a flowchart showing the digital signal conversion operation of this embodiment.

First, when a digital signal is input to the digital-conversion apparatus 1, the polarity-inversion circuit 11 inverts the polarity of that input digital signal (step S11). Next, the interpolation circuit (A) 12 calculates the time Wa at the point of intersection between the straight line that connects sample value $X_n$ at the current sampling point n of the input digital signal and the sample value $X_{n+1}$ at the next sampling point n+1, and the reference signal R(t), and calculates the amplitude Xqa at that time Wa using Lagrange interpolation (step S12).

The other hand, the interpolation circuit (B) 13 calculates the time Wb at the point of intersection between the straight line that connects the inverted value $-X_n$ of the digital signal, and the inverted value $-X_{n+1}$ of the next sample value, and calculates the amplitude Xqb at that time Wb using Lagrange interpolation (step S13).

Next, after the amplitude Xqa at the time Wa calculated by the interpolation circuit (A) 12 has been output, the PWM conversion circuit (A) 14 generates the PWM (A) signal based on the Xqa signal, and after the amplitude Xqb at time Wb calculated by the interpolation circuit (B) 13 has been output, the PWM conversion circuit (B) 15 generates the PWM (B) signal based on the Xqb signal (step 14).

Finally, after the PWM (A) signal is output from the PWM conversion circuit (A) 14 and the PWM (B) signal is output from the PWM conversion circuit (B) 15, the switching circuit 16 performs the switching process described above based on each of the PWM signals, and outputs the switched signal (step S15).

Figure 11:
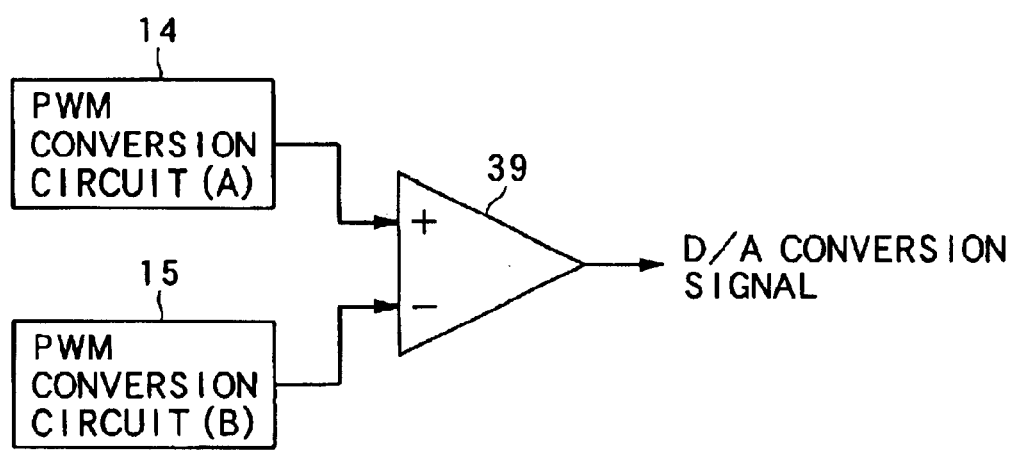
FIG. 11 is a drawing showing the construction of the output device when the digital signal conversion apparatus is a D/A converter.

When the digital signal conversion apparatus 1 described above is used as an A/D conversion circuit as shown in FIG. 11, the digital signal conversion apparatus 1 is equipped with a differential amplifier 39 to which the signal output from the PWM conversion circuit (A) 14 and the signal output from the PWM conversion circuit (B) 15 are input. Furthermore, this differential amplifier 39 subtracts the PWM (B) signal from the PWM (A) signal, and outputs the result as the D/A converted signal. In other words, in this case, as shown in FIG. 11, the differential amplifier 39 is able to subtract the PWM (B) signal from the PWM (A) signal. Therefore, the digital signal conversion apparatus 1 is able to obtain a three-value PWM (0) signal and thus is able to obtain a three-value PWM signal.

Furthermore, although the digital conversion process is performed by the digital signal conversion apparatus described above according to this embodiment, the digital signal conversion apparatus may be equipped with a computer and recording medium and a similar digital signal conversion process may be performed as the computer reads a digital signal conversion program stored on the recording medium.

On this digital signal conversion apparatus which executes the digital signal conversion program, a DVD or CD may be used as the recording medium.

In this case, digital signal conversion apparatus will be equipped with a reading device for reading the program from the recording medium.

(Embodiment 2)

Next, a second embodiment of the digital signal conversion apparatus of this invention will be explained by using FIG. 12 to FIG. 14.

In this embodiment, a digital signal conversion apparatus drives load using a three-value PWM signal, and together with improving the accuracy of approximation by interpolation and reducing non-linear distortion, it improves power efficiency since the output is zero when the input digital signal is zero, and furthermore it has little quantization noise in the audible range.

Figure 12:
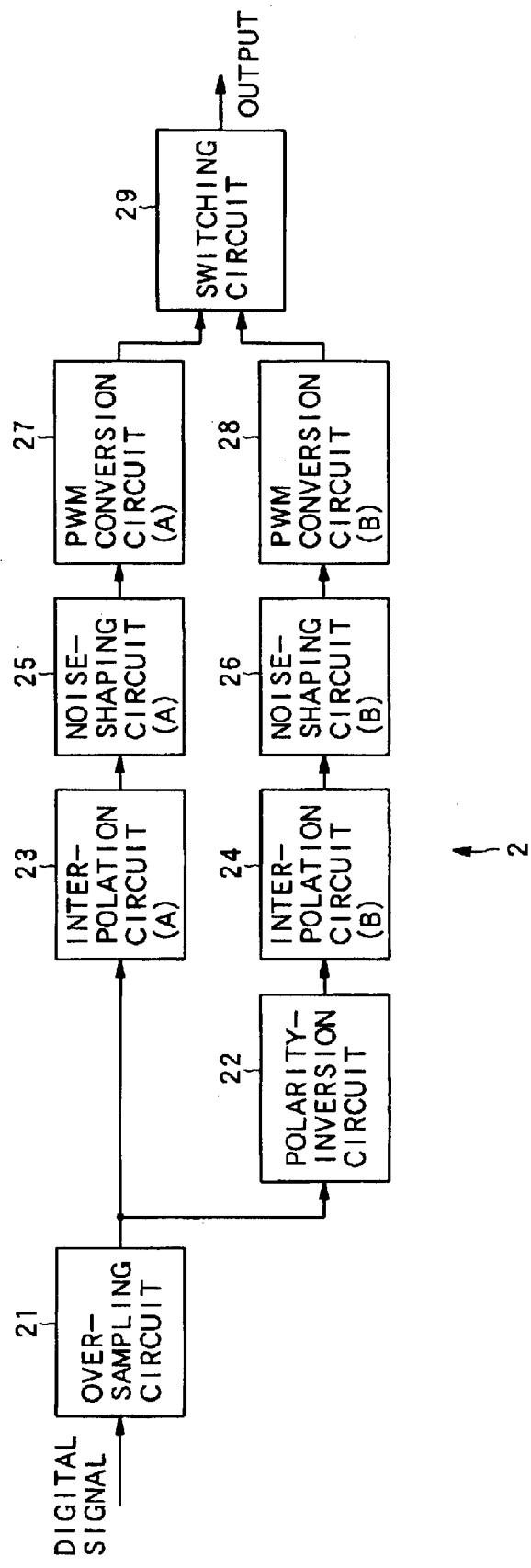
FIG. 12 is a block diagram showing the construction of the digital signal conversion apparatus of a second embodiment of the invention.

FIG. 12 is a block diagram showing the construction of the digital signal conversion apparatus of this second embodiment of the invention.

As shown in FIG. 12, the digital signal conversion apparatus of this embodiment comprises: a over-sampling circuit 21 that samples the input digital signal at high frequency; a polarity-inversion circuit 22 that inverts the polarity of the digital signal sampled by the over-sampling circuit 21; an interpolation circuit (A) 23 that performs interpolation on the input digital signal; an interpolation circuit (B) 24 that performs interpolation on the inverted digital signal; a noise-shaping circuit (A) 25 that performs noise shaping on the signal interpolated by the interpolation circuit (A) 23; a noise-shaping circuit (B) 26 that performs noise shaping on the signal interpolated by the interpolation circuit (B) 24; a PWM conversion circuit (A) 27 that performs PWM conversion on the signal from the noise-shaping circuit (A) 25; a PWM conversion circuit (B) 28 that performs PWM conversion on the signal from the noise-shaping circuit (B) 26; and a switching circuit 29 for driving the load based on the PWM signals from the PWM conversion circuit (A) 27 and PWM conversion circuit (B) 28.

The over-sampling circuit 21 is a circuit that performs sampling of the input digital signal by using n times higher frequency than the original frequency.

The polarity-inversion circuit 22 generates a digital signal having inverted polarity with respect to the over sampled digital signal, and performs this conversion at all of the sampling points. For example, similar to described above and as shown in FIG. 2, the polarity-inversion circuit 22 generates a digital signal −Xn as the inverted signal at sampling point n when the digital signal value at sampling point n is Xn.

Similar to as explained above, the interpolation circuit (A) 23 performs interpolation so as to reduce the difference between the position where the input digital signal intersects with a sawtooth-shaped reference signal and the position of intersection of the original analog signal and reference signal, and reduces distortion.

Similar to as explained above, the interpolation circuit (B) 24 performs interpolation so as to reduce the difference between the position where the inverted input digital signal intersects with a reference signal and the the position of intersection of the inverted original analog signal and sawtooth-shaped reference signal, and reduces distortion.

The noise-shaping circuit (A) 25 reduces the quantization bit number in order to lower the clock frequency during PWM conversion from the digital signal interpolated by the interpolation circuit (A) 23, and shifts the quantization noise into the high-frequency range.

The noise-shaping circuit (B) 26 reduces the quantization bit number in order to lower the clock frequency during PWM conversion from the inverted digital signal interpolated by the interpolation circuit (B) 24, and shifts the quantization noise into the high-frequency range.

The noise shaping by the noise-shaping circuit (A) 25 and noise-shaping circuit (B) 26 will be explained by using FIG. 12.

The PWM conversion circuit (A) 27 performs PWM conversion based on the points of intersection between the signal interpolated by the interpolation circuit (A) 23 and the reference signal such that the sections where the interpolated signal are higher than the reference signal are high level, and generates a not PWM converted signal (hereafter called the not PWM (A) signal) whose level is inverted with respect that of this PWM converted signal (hereafter called the PWM (A) signal).

The PWM conversion circuit (B) 28 performs PWM conversion based on the points of intersection between the signal interpolated by the interpolation circuit (B) 24 and the reference signal such that the sections where the interpolated signal are higher than the reference signal are high level, and generates a not PWM converted signal (hereafter called the not PWM (B) signal) whose level is inverted with respect that of this PWM converted signal (hereafter called the PWM (B) signal).

The switching circuit 29, as described above, is a circuit for driving the load based on the PWM (A) signal, not PWM (A) signal, PWM (B) signal and not PWM (B) signal. This switching circuit 29 is capable of driving the load using a three-value PWM signal, and since the output becomes zero when the input digital signal is zero, it can be used in forming a digital signal conversion apparatus having good power efficiency.

In this embodiment, noise shaping is used to reduce the number of quantization bits, and the signal for Xqa is obtained by performing interpolation on the input digital signal as shown in FIG. 2. Furthermore, in this embodiment, PWM conversion is performed by the PWM conversion circuit (A) 27 after the obtained Xqa signal has passed through the noise-shaping circuit (A) 25 to obtain the PWM (A) signal. The other hand, in this embodiment, the Xqb signal is similarly obtained by performing interpolation on the inverted digital data as shown in FIG. 3, and PWM conversion is performed by the PWM conversion circuit (B) 28 after the obtained Xqb signal has passed through the noise-shaping circuit (B) 26 to obtain the PWM (B) signal.

Moreover, in this embodiment, the interpolation method and the procedure driving the load are the same as in the first embodiment, and an explanation of them here again will be omitted.

Next, the noise shaping performed in this embodiment will be explained by using FIGS. 13A and 13B.

Figure 13A:
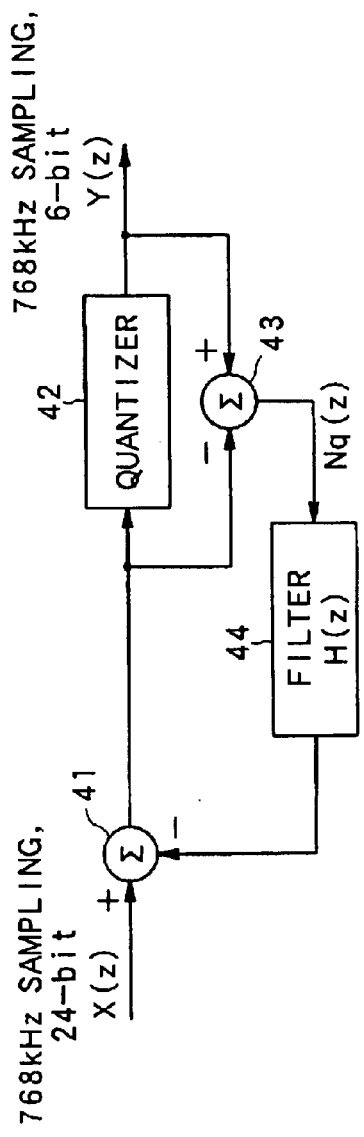
FIG. 13A is a drawing for explaining noise shaping.
Figure 13B:
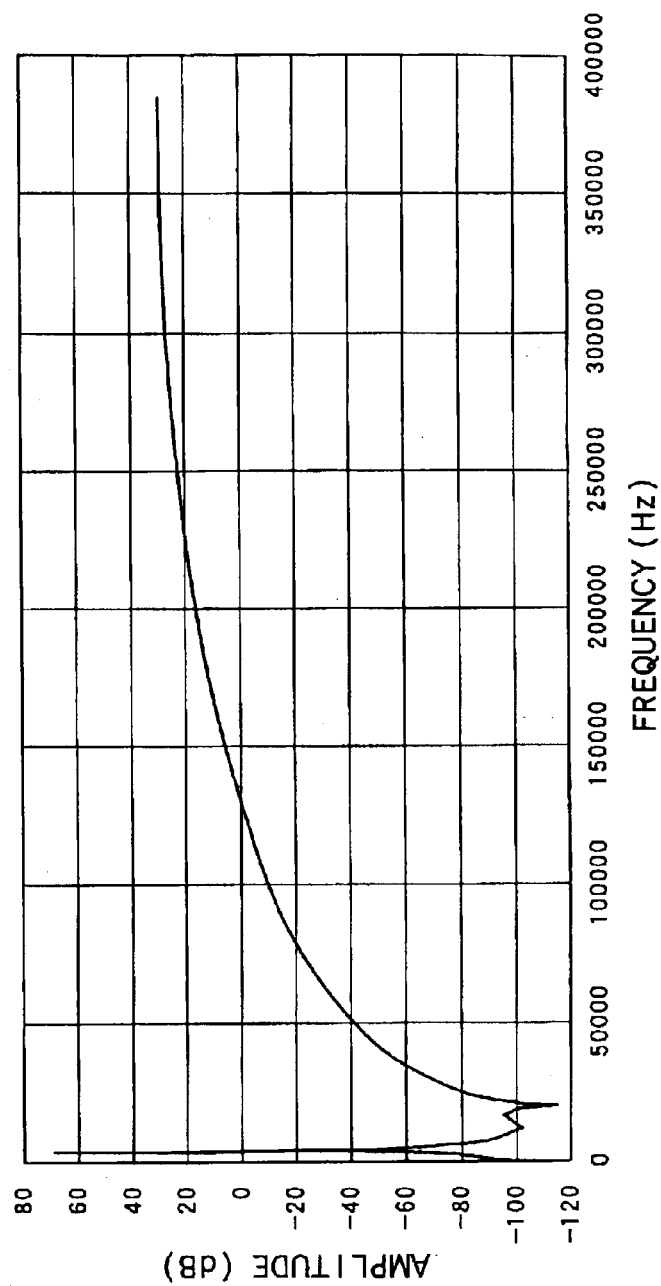
FIG. 13B is a drawing for explaining noise shaping.

FIGS. 13A and 13B are drawings for explaining the noise shaping performed in this embodiment. The noise shaping process in this embodiment corresponds to step S25 and step S26 of the digital conversion operation to be described later.

Normally, when performing PWM conversion, it is necessary to reduce the number of quantization bits in order to lower the clock frequency for PWM. However, when the number of quantization bits are reduced simply, the quantization noise increases, which causes the SN ratio to become poor.

Therefore, in this embodiment, in the noise-shaping circuit shown in FIG. 13A, after the number of quantization bits has been reduced by the quantizer 42, the quantization noise Nq is calculated by an adder 43 based on the input and output of the quantizer 42. Furthermore, the this calculated quantization noise Nq(z) is passed through a filter H(z) 44 and to supply negative feedback at the adder 41. The quantization noise is changed by this negative feedback and shifted to the high-frequency range. Therefore, in this embodiment, by this process it is possible to increase the SN ratio in the audible range.

Here, when the input to the noise shaping circuit is taken to be X(z) the output Y(z) is given by equation (5).

$$Y(z)=X(z)+[1-H(z)]Nq(z) \quad \text{(Eq. 5)}$$

Also, the quantization noise N'q(z) after noise shaping is transformed as given by equation (6).

$$N'q(z)=[1-H(z)]Nq(z) \quad \text{(Eq. 6)}$$

FIG. 13B shows the quantization spectrum after 6-bit noise shaping at a 768 kHz sampling for a 24-bit 5 kHz sine wave. The noise-shaping circuit is not limited to the circuit described above.

Next, the digital signal conversion operation of the digital signal conversion apparatus of this embodiment will be explained by using FIG. 14.

Figure 14:
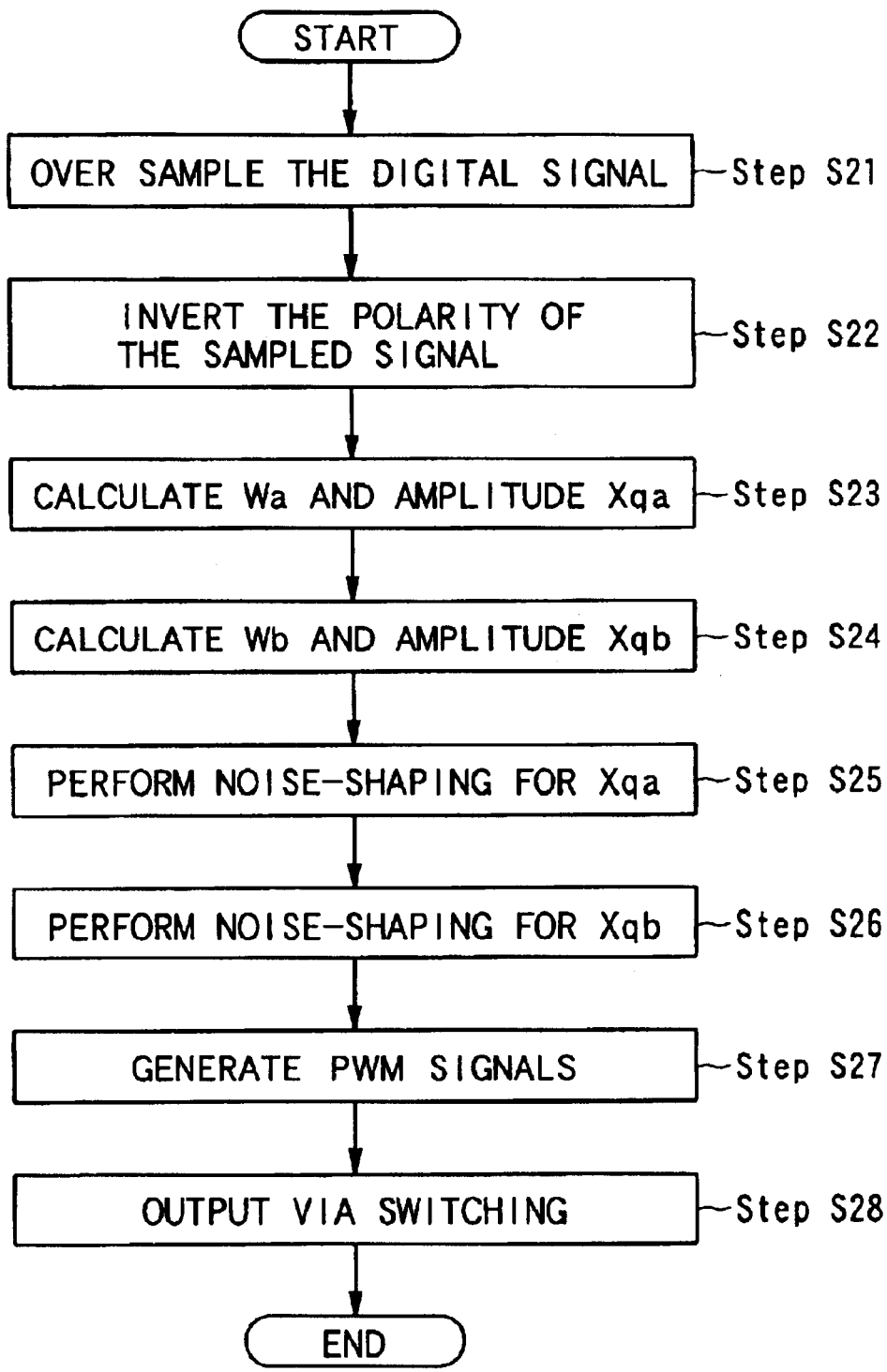
FIG. 14 is a flowchart showing the digital signal conversion operation of this second embodiment of the invention.

FIG. 14 is a flowchart showing the digital signal conversion operation of this embodiment.

First, after a digital signal has been input to the digital-conversion apparatus 1, the over-sampling circuit 21 performs sampling of the input digital signal (step S21).

Next, after the sampled signal is output from the over-sampling circuit 21, the polarity-inversion circuit 11 inverts the polarity of the sampled signal (step S22). Furthermore, the interpolation circuit (A) 12 calculates the time Wa at the point of intersection between the straight line that connects the sample value $X_n$ at the current sampling point n of the sample signal and the sample value $X_{n+1}$ at the next sampling point n+1, and the reference signal R(t), and then using Lagrange interpolation, the interpolation circuit (A) 12 calculates the amplitude Xqa at that time Wa (step S23).

The other hand, as described above, the interpolation circuit (B) 13 calculates the time Wb at the point of intersection between the straight line that connects the inverted value $-X_n$ of current sample value of the inverted sampled signal and the inverted value $-X_{1+1}$ of the next sample, and the reference signal R(t), and then using Lagrange interpolation, the interpolation circuit (B) 13 calculates the amplitude Xqb at that time Wb (step S24).

Next, after the amplitude Xqa at the time Wa calculated by the interpolation circuit (A) 23 is output, the noise-shaping circuit (A) 25 calculates the quantization noise Nq(z) and performs negative feedback to transform the quantization noise by the negative feedback and shift it to the high-frequency range (step S25).

The other hand, after the amplitude Xqb at the time Wb calculated by the interpolation circuit (B) 24 is output, the noise-shaping circuit (B) 26 calculates the quantization noise Nq(z) and performs negative feedback to transform the quantization noise by the negative feedback and shift it to the high-frequency range (step S26).

Next, after the interpolated signal for which the quantization noise is shifted to the high-frequency range by the noise-shaping circuit (A) 25 and the interpolated signal for which the quantization noise is shifted to the high-frequency range by the noise-shaping circuit (B) 26 are output, the PWM conversion circuit (A) 27 generates the PWM (A) signal based on the output Xqa signal, and the PWM conversion circuit (B) 28 generates the PWM (B) signal based on the output Xqb signal (step S27).

Finally, after the PWM (A) signal has been output from the PWM conversion circuit (A) 27 and the PWM (B) signal has been output from the PWM conversion circuit (B) 28, the switching circuit 29 performs the switching process based on the PWM signals as described above, and output the switched signal (step S28).

This invention is not limited to the embodiments described above and can be changed within the range of the invention as disclosed in the claims. A digital signal conversion apparatus and digital signal conversion method that results from such changes is also included in the technical range and concept of this invention.

Furthermore, although the digital conversion process is performed by the digital signal conversion apparatus described above according to this embodiment, the digital signal conversion apparatus may be equipped with a computer and recording medium and a similar digital signal conversion process may be performed as the computer reads a digital signal conversion program stored on the recording medium.

On this digital signal conversion apparatus which executes the digital signal conversion program, a DVD or CD may be used as the recording medium.

In this case, digital signal conversion apparatus will be equipped with a reading device for reading the program from the recording medium.

The entire disclosure of Japanese Patent Application No. 2002-187745 filed on Jun. 27, 2002 including the specification, claims, drawings and summary is incorporated herein by reference in its entirety.

What is claimed is:

1. A digital signal conversion apparatus comprising:
   a polarity-inversion device for inverting a polarity of an input digital signal;
   a first interpolation device for interpolating the input digital signal;
   a second interpolation device for interpolating the digital signal inverted by said polarity-inversion device;
   a first conversion device for performing PWM conversion on the signal interpolated by said first interpolation device;
   a second conversion device for performing PWM conversion on the signal interpolated by said second interpolation device; and
   an output device for outputting a PWM signal based on the output from said first conversion device and output from said second conversion device.

2. The digital signal conversion apparatus according to claim 1, in case where said input digital signal is performed over sampling, said digital signal conversion apparatus further comprising:
   a first noise-shaping device for performing noise shaping on the signal interpolated by said first interpolation device and outputting the signal performed noise shaping to said first PWM conversion device; and
   a second noise-shaping device for performing noise shaping on the signal interpolated by said second interpolation device and outputting the signal performed noise shaping to said second PWM conversion device.

3. The digital signal conversion apparatus according to claim 2, further comprising:
   a first inversion device for inverting a level of the output from said first PWM conversion device; and
   a second inversion device for inverting a level of the output from said second PWM conversion device.

4. The digital signal conversion apparatus according to claim 1, further comprising:
  a first inversion device for inverting a level of the output from said first PWM conversion device; and
  a second inversion device for inverting a level of the output from said second PWM conversion device.

5. The digital signal conversion apparatus according to claim 4, wherein said output device is a H-bridge type switching circuit.

6. The digital signal conversion apparatus according to claim 1, wherein said output device is a differential amplifier.

7. The digital signal conversion apparatus according to claim 1, wherein
  said first interpolation device interpolates the input digital signal based on positions where the input digital signal intersects with a reference signal and positions where an original analog signal converted into the input digital signal intersects with the reference signal, and
  said second interpolation device interpolates the inverted input digital signal based on positions where the inverted input digital signal intersects with the reference signal and positions where an inverted original analog signal converted into the input digital signal intersects with the reference signal.

8. The digital signal conversion apparatus according to claim 7, wherein
  said first interpolation device interpolates the input digital signal by calculating time at the position where the input digital signal intersects with the reference signal and an amplitude at the calculated time of the analog signal every sample value of the input digital signal based on positions where the input digital signal intersects with a reference signal and positions where an original analog signal converted into the input digital signal intersects with the reference signal, and
  said second interpolation device interpolates the inverted input digital signal by calculating time at the position where the inverted input digital signal intersects with the reference signal and an amplitude at the calculated time of the analog signal every sample value of the inverted input digital signal based on positions where the inverted input digital signal intersects with the reference signal and positions where an inverted original analog signal converted into the input digital signal intersects with the reference signal.

9. A digital signal conversion method comprising:
  a polarity-inversion process of inverting a polarity of an input digital signal;
  a first interpolation process of interpolating the input digital signal;
  a second interpolation process of interpolating the digital signal inverted by said polarity-inversion process;
  a first conversion process of performing PWM conversion on the signal interpolated by said first interpolation process;
  a second conversion process of performing PWM conversion on the signal interpolated by said second interpolation process; and
  an output process of outputting a PWM signal based on the output from said first conversion process and output from said second conversion process.

10. The digital signal conversion method according to claim 9, in case where said input digital signal is performed over sampling, said digital signal conversion method further comprising:
  a first noise-shaping process of performing noise shaping on the signal interpolated by said first interpolation process; and
  a second noise-shaping process of performing noise shaping on the signal interpolated by said second interpolation process,
  wherein said first conversion process performs PWM conversion on the signal performed noise shaping by said first noise-shaping process, and
  said second conversion process performs PWM conversion on the signal performed noise shaping by said second noise-shaping process.

11. The digital signal conversion method according to claim 10, further comprising:
  a first inversion process of inverting a level of the output from said first PWM conversion process; and
  a second inversion process of inverting a level of the output from said second PWM conversion process.

12. The digital signal conversion method according to claim 9, further comprising:
  a first inversion process of inverting a level of the output from said first PWM conversion process; and
  a second inversion process of inverting a level of the output from said second PWM conversion process.

13. The digital signal conversion method according to claim 9, wherein
  said first interpolation process interpolates the input digital signal based on positions where the input digital signal intersects with a reference signal and positions where an original analog signal converted into the input digital signal intersects with the reference signal, and
  said second interpolation process interpolates the inverted input digital signal based on positions where the inverted input digital signal intersects with the reference signal and positions where an inverted original analog signal converted into the input digital signal intersects with the reference signal.

14. The digital signal conversion method according to claim 13, wherein
  said first interpolation process interpolates the input digital signal by calculating time at the position where the input digital signal intersects with the reference signal and an amplitude at the calculated time of the analog signal every sample value of the input digital signal based on positions where the input digital signal intersects with a reference signal and positions where an original analog signal converted into the input digital signal intersects with the reference signal, and
  said second interpolation process interpolates the inverted input digital signal by calculating time at the position where the inverted input digital signal intersects with the reference signal and an amplitude at the calculated time of the analog signal every sample value of the inverted input digital signal based on positions where the inverted input digital signal intersects with the reference signal and positions where an inverted original analog signal converted into the input digital signal intersects with the reference signal.

15. A recording medium wherein a digital signal conversion program is recorded so as to be read by a computer, the computer included in a digital signal conversion apparatus, the program causing the computer to function as:
  a polarity-inversion device for inverting s polarity of an input digital signal;
  a first interpolation device for interpolating the input digital signal;

a second interpolation device for interpolating the digital signal inverted by said polarity-inversion device;

a first conversion device for performing PWM conversion on the signal interpolated by said first interpolation device;

a second conversion device for performing PWM conversion on the signal interpolated by said second interpolation device; and an output device for outputting a PWM signal based on the output from said first conversion device and output from said second conversion device.

16. The information recorded medium according to claim 15, in case where said input digital signal is performed over sampling, wherein the digital signal conversion program further causes the computer to function as:

a first noise-shaping device for performing noise shaping on the signal interpolated by said first interpolation device;

a second noise-shaping device for performing noise shaping on the signal interpolated by said second interpolation device;

said first conversion device performing PWM conversion on the signal performed noise shaping by said first noise-shaping device; and said second conversion device performing PWM conversion on the signal performed noise shaping by said second noise-shaping device.

* * * * *